(12) United States Patent
Yoshii et al.

(10) Patent No.: US 6,940,708 B2
(45) Date of Patent: Sep. 6, 2005

(54) ELECTRONIC COMPONENT

(75) Inventors: Akitoshi Yoshii, Tokyo (JP); Masanori Yamamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/914,129

(22) Filed: Aug. 10, 2004

(65) Prior Publication Data

US 2005/0041367 A1 Feb. 24, 2005

(30) Foreign Application Priority Data

Aug. 19, 2003 (JP) ........................................ 2003-295309

(51) Int. Cl.$^7$ .............................................. H01G 4/005
(52) U.S. Cl. .................. 361/303; 361/306.1; 361/308.1; 361/309; 361/329
(58) Field of Search ................................ 361/303–304, 361/306.1, 306.3, 309, 310, 307, 328–329, 308.1

(56) References Cited

U.S. PATENT DOCUMENTS 6,191,933 B1 * 2/2001 Ishigaki et al. ............. 361/309
6,288,887 B1 * 9/2001 Yoshida et al. ........... 361/306.1
6,704,189 B2 * 3/2004 Yoshii et al. ............. 361/308.1
6,781,816 B2 * 8/2004 Togashi .................... 361/306.3

FOREIGN PATENT DOCUMENTS

| JP | 11-74147 | 3/1999 |
|---|---|---|
| JP | 11-329892 | 11/1999 |
| JP | 2000-235931 | 8/2000 |
| JP | 2000-306764 | 11/2000 |

* cited by examiner

*Primary Examiner*—Anthony Dinkins
(74) *Attorney, Agent, or Firm*—Oblon, Spivak, McClelland, Maier & Neustadt, P.C.

(57) ABSTRACT

An electronic component includes: an element having a pair of terminal electrodes; and a pair of metal terminals formed of metal materials respectively and connected to the pair of terminal electrodes respectively, in which: a portion of the metal terminal that extends from a base-end side of the metal terminal connectable to an external circuit to face the terminal electrode of the element is an electrode facing portion; and a tip side portion of the metal terminal in the electrode facing portion is connected to the terminal electrode, and a gap exists between a base-end side portion of the metal terminal in the electrode facing portion and the terminal electrode. Therefore, the electronic component is capable of fully absorbing a stress and realizes reduction in production cost.

19 Claims, 9 Drawing Sheets

ELECTRONIC COMPONENT

BACKGROUND OF THE INVENTION

1. Field of the Invention

The present invention relates to an electronic component capable of fully absorbing a stress and realizing reduction in production cost, and more particularly, to the electronic component suitable for use as a multilayer ceramic capacitor.

2. Description of the Related Art

In recent years, multilayer ceramic capacitors that are chip-type electronic components made of ceramic have come into general use for a substrate. However, in the structure in which this multilayer ceramic capacitor is directly mounted on the substrate, if the substrate is deformed by deflection due to a stress given to the substrate itself, a mechanical stress is given to the multilayer ceramic capacitor, which may possibly lead to the occurrence of a crack.

Further, an aluminum substrate uses aluminum as a base of the substrate and thus its coefficient of thermal expansion is large. Therefore, when a multilayer ceramic capacitor made of ceramic whose coefficient of thermal expansion greatly differs from that of aluminum is directly mounted on this substrate, a large thermal stress is generated. This thermal stress may also possibly cause a crack in the multilayer ceramic capacitor.

As a solution to the aforesaid crack problem that may occur when ceramic capacitor elements being body portions of multilayer ceramic capacitors are mounted on a substrate, known is a multilayer ceramic capacitor in which a pair of metal terminals serving as metal caps each having a fold part are attached to the capacitor elements.

As a specific example of the conventional multilayer ceramic capacitor, FIG. 9 shows the external appearance of a multilayer capacitor 100, which will be described below with reference to this drawing.

In the multilayer capacitor 100 shown in FIG. 9, a pair of metal terminals 102, 103 attached to and sandwiching two capacitor elements 101 are formed in a U-shape, with upper parts thereof folded, so as not to become larger than necessary. The pair of metal terminals 102, 103 absorb and alleviate the deflection of the substrate by their elastic deformation, thereby weakening a stress generated in the ceramic capacitor elements 101.

However, part cost necessary for manufacturing the metal terminals 102, 103, which are used as parts, has been increased due to poor machinability when the metal terminals 102, 103 serving as caps are machined so as to have the fold parts as described above. Moreover, since there are gaps in the fold parts of the metal terminals 102, 103, components are easily entangled with each other because part of other metal terminals get in the gaps and due to other reasons, which worsens work efficiency. As a result, the conventional multilayer capacitor 100 shown in FIG. 9 has a disadvantage of higher total production cost.

SUMMARY OF THE INVENTION

In view of the above-described circumstances, it is an object of the present invention to provide an electronic component capable of fully absorbing a stress and realizing reduction in production cost.

According to one of the modes of the present invention, provided is an electronic component including: an element having a pair of terminal electrodes; and a pair of metal terminals formed of metal materials respectively and connected to the pair of terminal electrodes respectively, wherein: a portion of the metal terminal that extends from a base-end side of the metal terminal connectable to an external circuit to face the terminal electrode of the element is an electrode facing portion; and a tip side portion of the metal terminal in the electrode facing portion is connected to the terminal electrode, and a gap exists between a base-end side portion of the metal terminal in the electrode facing portion and the terminal electrode.

Such an electronic component has the following operation.

The electronic component according to this mode is structured to have the element having the pair of terminal electrodes and the pair of metal terminals connected to the pair of terminal electrodes respectively. Further, the electrode facing portion of the metal terminal extending from the base-end side of the metal terminal connectable to the external circuit to face the terminal electrode of the element is connected to the terminal electrode. In this mode, however, only the tip side portion of the metal terminal in the electrode facing portion is connected to the terminal electrode, and the gap exists between the base-end side portion of the metal terminal in the electrode facing portion and the terminal electrode.

Therefore, according to this mode, the actual distance from the portion connectable to the external circuit to the portion connected to the terminal electrode of the element can be made long since the base-end side portion in the electrode facing portion of the metal terminal has the structure such that the gap exists between the electrode facing portion and the terminal electrode of the element.

Therefore, according to this mode, the increase in the distance therebetween allows large elastic deformation of the metal terminal without making the metal terminal larger than necessary. Owing to this elastic deformation, the metal terminal can surely absorb the deflection and thermal expansion of a substrate to reduce a mechanical stress and a thermal stress occurring in the element, so that the occurrence of a crack in the element can be prevented.

Moreover, according to this mode, part cost is reduced since machining for forming fold parts in the metal terminals is not necessary. Further, owing to the elimination of the fold parts, gaps in the metal terminals are also eliminated. This enhances work efficiency since components are not entangled with each other, resulting in reduction-in total production cost of the electronic component.

As described above, according to this mode, an electronic component capable of fully absorbing a stress and realizing reduction in production cost is obtainable.

According to another mode of the present invention, provided is an electronic component including: an element having a pair of terminal electrodes; and a pair of metal terminals formed of metal materials respectively and connected to the pair of terminal electrodes respectively, wherein: a portion of the metal terminal that extends from a base-end side of the metal terminal connectable to an external circuit to face the terminal electrode of the element is an electrode facing portion; a tip side portion of the metal terminal in the electrode facing portion is connected to the terminal electrode, and a gap exists between a base-end-side portion of the metal terminal in the electrode facing portion and the terminal electrode; and when a distance between a surface of the element on an external circuit side and a base end of the metal terminal is set to 0.4 mm or less, a distance between the portion of the metal terminal connected to the terminal electrode and the base end of the metal terminal is set to 0.8 mm or more.

Such an electronic component has the following operation.

The electronic component according to this mode includes the same structure as that of the electronic component according to the mode previously described. It further has the structure such that, when the distance between the surface of the element on the external circuit side and the base end of the metal terminal is set to 0.4 mm or less, the distance between the portion of the metal terminal connected to the terminal electrode and the base end of the metal terminal is set to 0.8 mm or more.

Therefore, according to this mode, since the distance between the surface of the element and the base end of the metal terminal is set to 0.4 mm or less, the metal terminal does not become larger than necessary. Further, since the distance between the portion of the metal terminal connected to the terminal electrode and the base end of the metal terminal connectable to the external circuit is twice as long as the distance from the base end of the metal terminal to the element, or longer, larger elastic deformation of the metal terminal is made possible. As a result, the metal terminal can more surely absorb the stress that may possibly occur in the element.

According to still another mode of the present invention, provided is an electronic component including: an element having a pair of terminal electrodes; and a pair of metal terminals formed of metal materials respectively and connected to the pair of terminal electrodes respectively, wherein: portions of the respective metal terminals that extend from base-end sides of the metal terminals connectable to external circuits to face the terminal electrodes of the element are electrode facing portions; and tip side portions of the pair of metal terminals in the respective electrode facing portions of the metal terminals are connected to the terminal electrodes respectively and gaps exist between the base-end side portions of the pair of metal terminals in the respective electrode facing portions of the metal terminals and the terminal electrodes, respectively.

Such an electronic component has the following operation.

The electronic component according to this mode includes the same structure as that of the electronic component according to the aforesaid mode. It further has the structure such that the tip side portions of the pair of metal terminals in the respective electrode facing portions of the metal terminals are connected to the terminal electrodes respectively, and the gaps exist between the base-end side portions of the pair of metal terminals in the respective electrode facing portions of the metal terminals and the terminal electrodes respectively.

Therefore, according to this mode, since the gaps exist between the base-end side portions of the pair of metal terminals in the respective electrode facing portions of the metal terminals and the terminal electrodes respectively, large elastic deformation of the pair of metal terminals is made possible. As a result, in this mode, the metal terminals can absorb the stress given to the electronic component more surely.

Further, if the pair of metal terminals have the same structure and shape as in this mode, it is only necessary to manufacture metal terminals of one type in manufacturing the electronic component, which reduces part management cost. Accordingly, production cost of the electronic component can be also further reduced.

As a modification example of the electronic component according to each of the above-described modes of the present invention, such a structure is conceivable that the base end of the metal terminal connectable to the external circuit serves as an external connection portion that is bent at a right angle to the other portion.

Specifically, upper and lower faces of an element are generally set parallel to land patterns of a substrate when an electronic component is mounted on the substrate. In the electronic component according to this modification example, on the other hand, the external connection portion is bent at the right angle that is an optimum bending angle. This allows the external connection portion to be connected to the entire land pattern of the substrate. As a result, more reliable connection between the land pattern and the external connection portion is realized.

DETAILED DESCRIPTION OF THE PREFERRED EMBODIMENTS

Hereinafter, embodiments of the electronic component according to the present invention will be described based on the drawings.

Figure 1:
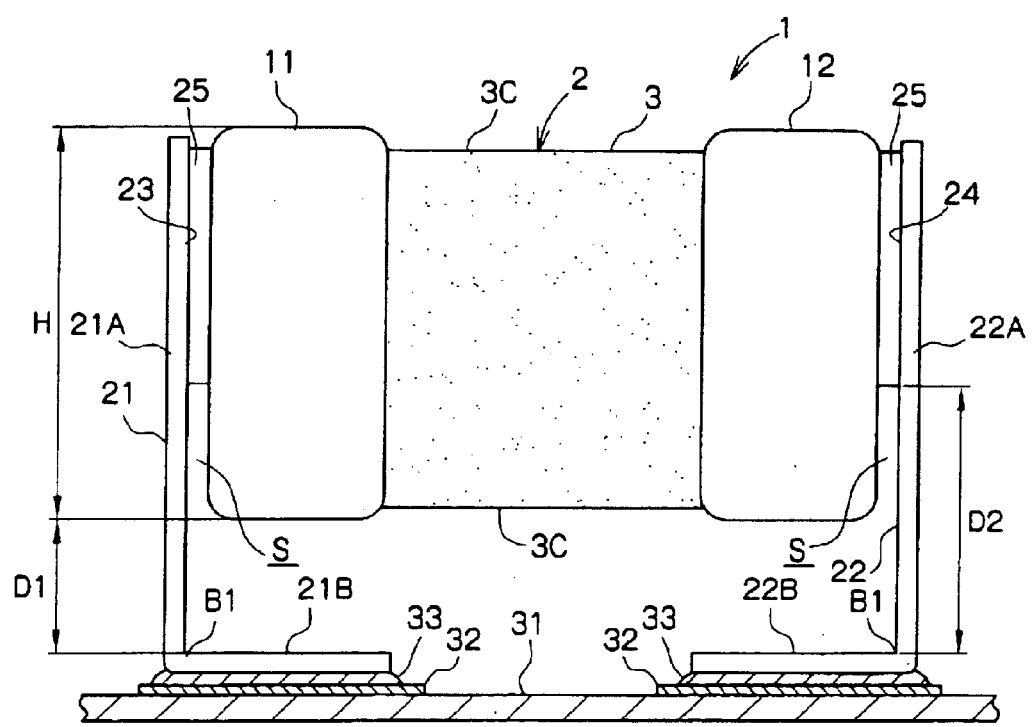
FIG. 1 is a front view showing a multilayer capacitor according to a first embodiment of the present invention and is a view showing the state where the multilayer capacitor is attached to a substrate.
Figure 2:
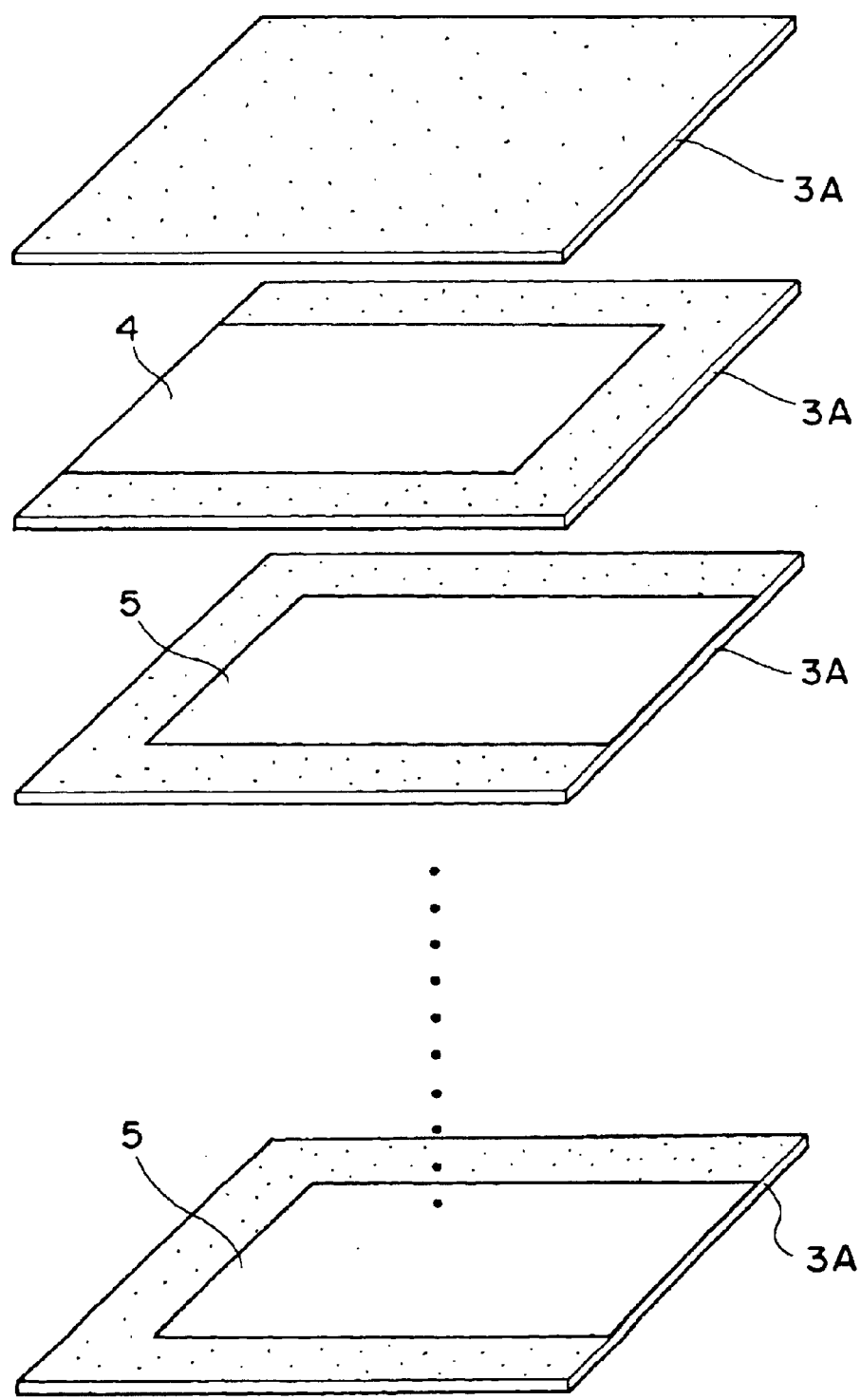
FIG. 2 is an exploded perspective view of a capacitor element applied to the first embodiment of the present invention.
Figure 3:
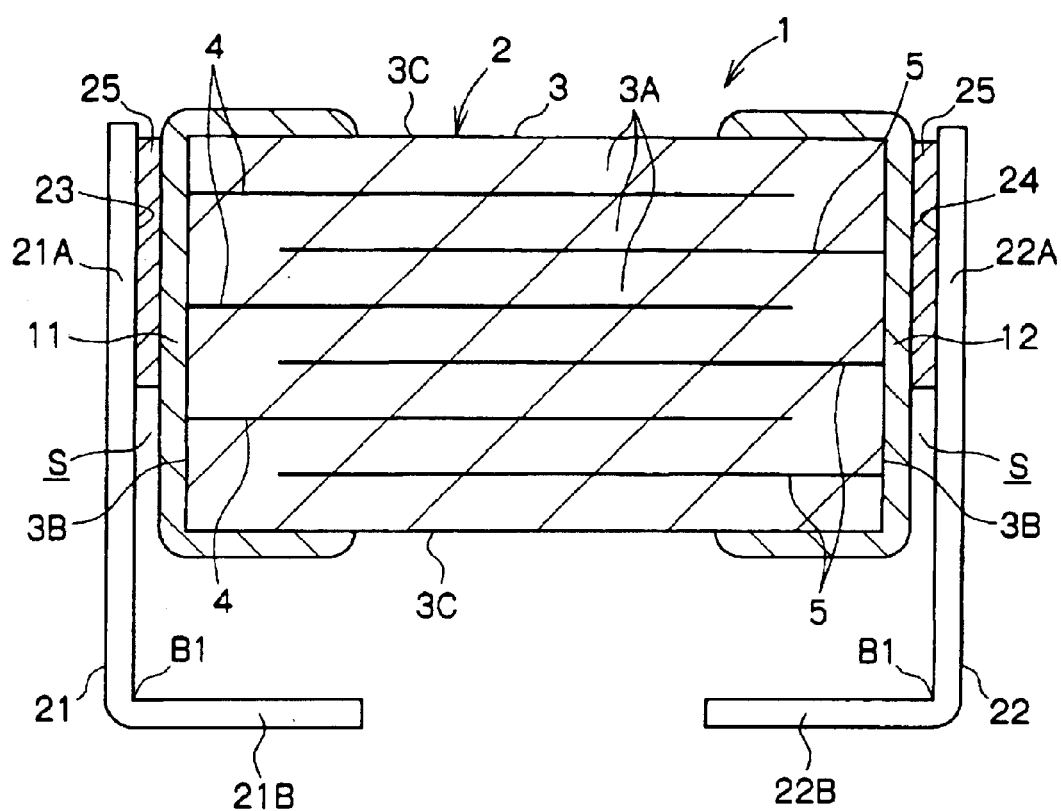
FIG. 3 is a front view showing the multilayer capacitor according to the first embodiment of the present invention, and is a view showing a cutaway state thereof.

FIG. 1 to FIG. 3 show a multilayer ceramic capacitor (hereinafter, referred to as a multilayer capacitor) 1 being an electronic component according to the first embodiment of the present invention. A capacitor element 2 has as a major portion thereof a dielectric element 3 that is a sintered compact in a rectangular parallelepiped shape obtained by sintering a multilayered body composed of a plurality of layered ceramic green sheets, and this capacitor element 2 serves as an element of the multilayer capacitor 1.

Therefore, the dielectric element 3 is formed of a stack of dielectric layers that are sintered ceramic green sheets. Further, as shown in FIG. 2 and FIG. 3, the dielectric element 3 has the internal structure such that planar internal conductors 4 are disposed at predetermined height positions, and internal conductors 5 similarly in a planar shape are disposed under the internal conductors 4 across ceramic layers 3A which are the dielectric layers in the dielectric element 3. The internal conductors 4 and the internal conductors 5 are housed inside the capacitor element 2 in such a manner that a plurality of layers (for example, about 100 layers) of the internal conductors 4 and the internal conductors 5 each similarly formed across the ceramic layer 3A are repeatedly arranged in the dielectric element 3.

Therefore, two kinds of the internal conductors, namely, the internal conductors 4 and the internal conductors 5, are arranged in the dielectric element 3 to face each other, being separated from each other by the ceramic layers 3A, as shown in FIG. 3. The centers of the internal conductors 4 and the internal conductors 5 are substantially aligned with the centers of the respective ceramic layers 3A. The width and length dimensions of the internal conductors 4 and the internal conductors 5 are smaller than the lengths of sides of the corresponding ceramic layers 3A, respectively.

Note that a conductor with the same width dimension as the width dimension of the internal conductor 4 protrudes from a left side portion of each of the internal conductors 4 toward a left end of the ceramic layer 3A as shown in FIG. 2. Further, a conductor with the same width dimension as the width dimension of the internal conductor 5 protrudes from the right side portion of each of the internal conductor 5 toward the right end of the ceramic layer 3A.

As shown in FIG. 3, a terminal electrode 11 connected to the left protruding portions of the internal conductors 4 is disposed on a left side face 3B that is an outer side of the dielectric element 3, and a terminal electrode 12 connected to the right protruding portions of the internal conductors 5 is disposed on a right side face 3B that is an outer side of the dielectric element 3.

As seen from the above description, the capacitor element 2 in this embodiment has the pair of terminal electrodes 11, 12 that are disposed on the two side faces 3B out of four side faces of the dielectric element 3 in a rectangular parallelepiped shape of the capacitor element 2.

As shown in FIG. 1 and FIG. 3, a pair of metal terminals 21, 22 each formed of a metal material abut respectively on both ends of the capacitor element 2 constituting the element of the multilayer capacitor 1 according to this embodiment. To be more specific, the metal terminal 21 faces the left terminal electrode 11 of the capacitor element 2, and the metal terminal 22 faces the right terminal electrode 12 of the capacitor element 2.

Further, the pair of metal terminals 21, 22 have electrode facing portions 21A, 22A extending from a lower side in FIG. 1 and FIG. 3, namely, from a base end side to face surfaces in a rectangular shape of the terminal electrodes 11, 12 of the capacitor element 2 respectively. In this embodiment, tip side portions (upper portions in FIG. 1 and FIG. 3) of the metal terminals 21, 22 in the respective electrode facing portions 21A, 22A of the pair of these metal terminals 21, 22 are joint portions 23, 24 connected to the terminal electrodes 11, 12 respectively.

Further, gaps S large enough to allow the deformation of the electrode facing portions 21A, 22A shown in FIG. 1 and FIG. 3 are provided between the terminal electrodes 11, 12 and the base-end side portions (lower portions in FIG. 1 and FIG. 3) of the metal terminals 21, 22 in the respective electrode facing portions 21A, 22A of the pair of these metal terminals 21, 22.

Incidentally, joining materials 25 are used for connection between the joint portion 23 of the metal terminal 21 and the terminal electrode 11 and for connection between the joint portion 24 of the metal terminal 22 and the terminal electrode 12 respectively. As the joining materials 25, for example, conductive adhesive containing high-temperature solder or resin is adopted.

Further, on lower sides of the electrode facing portions 21A, 22A, external connection portions 21B, 22B being base ends of the metal terminals 21, 22 are formed to bend toward the capacitor element 2 at a right angle to the electrode facing portions 21A, 22A. These external connection portions 21B, 22B are connectable to external circuits respectively. To be more specific, in this embodiment, the external connection portions 21B, 22B are connected to land patterns 32 as, for example, switching power sources of an aluminum substrate 31 via joining materials 33 such as solder, so that the internal conductors 4, 5 serve as electrodes of the capacitor, as shown in FIG. 1.

In this embodiment, the following relation is satisfied, where, as shown in FIG. 1, D1 is the distance from a lower face 3C of the dielectric element 3 being a surface of the capacitor element 2 facing the land patterns 32 to the external connection portions 21B, 22B being the base-end side portions of the metal terminals 21, 22, D2 is the distance from lower ends of the joint portions 23, 24 being the portions of the metal terminals 21, 22 connected to the terminal electrodes 11, 12 to the external connection portions 21B, 22B, and H is the height of the capacitor element 2. The relation satisfied is (D2−D1)≧0.4 mm, where the distance D1 is set to 0.4 mm or less and the distance D2 is set to 0.8 mm or more. Note that the distance D1 and the distance D2 have to be set so as to satisfy the relation of (H+D1)>D2 even when each of the distances D1, D2 varies.

In manufacturing the metal terminals 21, 22 made of metal, the metal terminals 21, 22 are first extruded from the metal materials, and thereafter, the metal terminals 21, 22 are bent along fold lines B1 respectively to be formed in the shape shown in FIG. 1 and FIG. 3. Then, the pair of these metal terminals 21, 22 are thereafter joined to the right and left of the single capacitor element 2 with the joining materials 25, so that the multilayer capacitor 1 shown in FIG. 1 and FIG. 3 is finished.

Next, the operation of the multilayer capacitor 1 according to this embodiment will be described.

The capacitor element 2 according to this embodiment is structured such that the plural internal conductors 4 and internal conductors 5 are disposed inside the dielectric element 3 formed by a stack of the ceramic layers 3A, being separated from each other by the ceramic layers 3A. Further, the pair of terminal electrodes 11, 12 are provided on the outer sides of the dielectric element 3.

The multilayer capacitor 1 according to this embodiment has not only the capacitor element 2 provided with the pair of these terminal electrodes 11, 12 but also the pair of metal terminals 21, 22. The pair of these metal terminals 21, 22 have the electrode facing portions 21A, 22A being the portions extending from the base-end sides of the pair of metal terminals 21, 22 connected to the land patterns 32 respectively to face the pair of terminal electrodes 11, 12 of the capacitor element 2.

Note that this embodiment is structured such that only the tip side portions of the metal terminals 21, 22 in the respective electrode facing portions 21A, 22A of the pair of the metal terminals 21, 22 are connected to the terminal electrodes 11, 12 respectively. Further, the gaps S exist between the base-end side portions of the metal terminals 21, 22 in the electrode facing portions 21A, 22A and the terminal electrodes 11, 12 respectively. Moreover, the base ends of the metal terminals 21, 22 serve as the external connection portions 21B, 22B that are bent along the fold lines B1 at the right angle to the other portions, and these external connection portions 21B, 22B are connected to the land patterns 32.

Therefore, in the base-end side portions of the pair of metal terminals 21, 22 in the respective electrode facing portions 21A, 22A, the gaps S exist between the electrode facing portions 21A, 22A and the terminal electrodes 11, 12 of the capacitor element 2. This structure can increase the actual distance from the external connection portions 21B, 22B connected to the land patterns 32 to the joint portions 23, 24 connected to the terminal electrodes 11, 12 of the capacitor element 2.

Accordingly, in this embodiment, the increased distance therebetween allows large elastic deformation of the metal terminals 21, 22 without making the metal terminals 21, 22 larger than necessary. Owing to this elastic deformation, the metal terminals 21, 22 can surely absorb the deflection and thermal expansion of the aluminum substrate 31 to reduce a mechanical stress and a thermal stress occurring in the capacitor element 2, so that the occurrence of a crack in the capacitor element 2 can be prevented.

Further, according to this embodiment, part cost is reduced since no machining is necessary for forming the fold parts in the metal terminals 21, 22. Moreover, work efficiency is enhanced since gaps in the metal terminals 21, 22 are eliminated due to the elimination of the fold parts, and thus, components are not entangled with each other. This results in the reduction in total production cost of the multilayer capacitor 1.

As seen from the above description, this embodiment can provide the multilayer capacitor 1 capable of fully absorbing the stress and realizing reduction in production cost.

Further, according to this embodiment, the gaps S are provided between the base-end side portions of the metal terminals 21, 22 in the respective electrode facing portions 21A, 22A of the pair of metal terminals 21, 22 and the terminal electrodes 11, 12, respectively. This structure allows large elastic deformation of the pair of metal terminals 21, 22. Accordingly, the metal terminals 21, 22 can more surely absorb the stress given to the multilayer capacitor 1.

Moreover, if the pair of metal terminals 21, 22 have the same structure and the same shape as in this embodiment, it is only necessary to manufacture metal terminals of one type in manufacturing the multilayer capacitor 1. This reduces part management cost, thereby achieving further reduction in production cost of the multilayer capacitor 1.

When the multilayer capacitor 1 is mounted on the aluminum substrate 31, the upper/lower faces 3C in the dielectric element 3 of the capacitor element 2 are generally set parallel to the land patterns 32 of the aluminum substrate 31. However, in this embodiment, the base ends of the metal terminals 21, 22 serving as the external connection portions 21B, 22B connected to the land patterns 32 are bent at the right angle, which is the optimum bending angle, relative to the other portions. This structure allows the external connection portions 21B, 22B to be connected to the entire land patterns 32 of the aluminum substrate 31 respectively. As a result, more reliable connection between the land patterns 32 and the external connection portions 21B, 22B is realized.

In this embodiment, the aforesaid distance D1 is set to 0.4 mm or less, and the distance D2 is set to 0.8 mm or more, and they are set to satisfy the relation of (D2−D1)≧0.4 mm. Therefore, since the distance D1 between the surface of the capacitor element 2 and the external connection portions 21B, 22B of the metal terminals 21, 22 is set to 0.4 mm or less, the metal terminals 21, 22 do not become larger than necessary.

Further, the distance D2 between the joint portions 23, 24 being the portions of the pair of metal terminals 21, 22 connected to the terminal electrodes 11, 12 respectively and the external connection portions 21B, 22B of the metal terminals 21, 22 connectable to the land patterns 32 is set twice as long as the distance D1 from the external connection portions 21B, 22B of the metal terminals 21, 22 to the capacitor element 2, or longer. This structure allows larger elastic deformation of the metal terminals 21, 22. As a result, the metal terminals 21, 22 can more surely absorb the stress that may possibly occur in the capacitor element 2.

Figure 4:
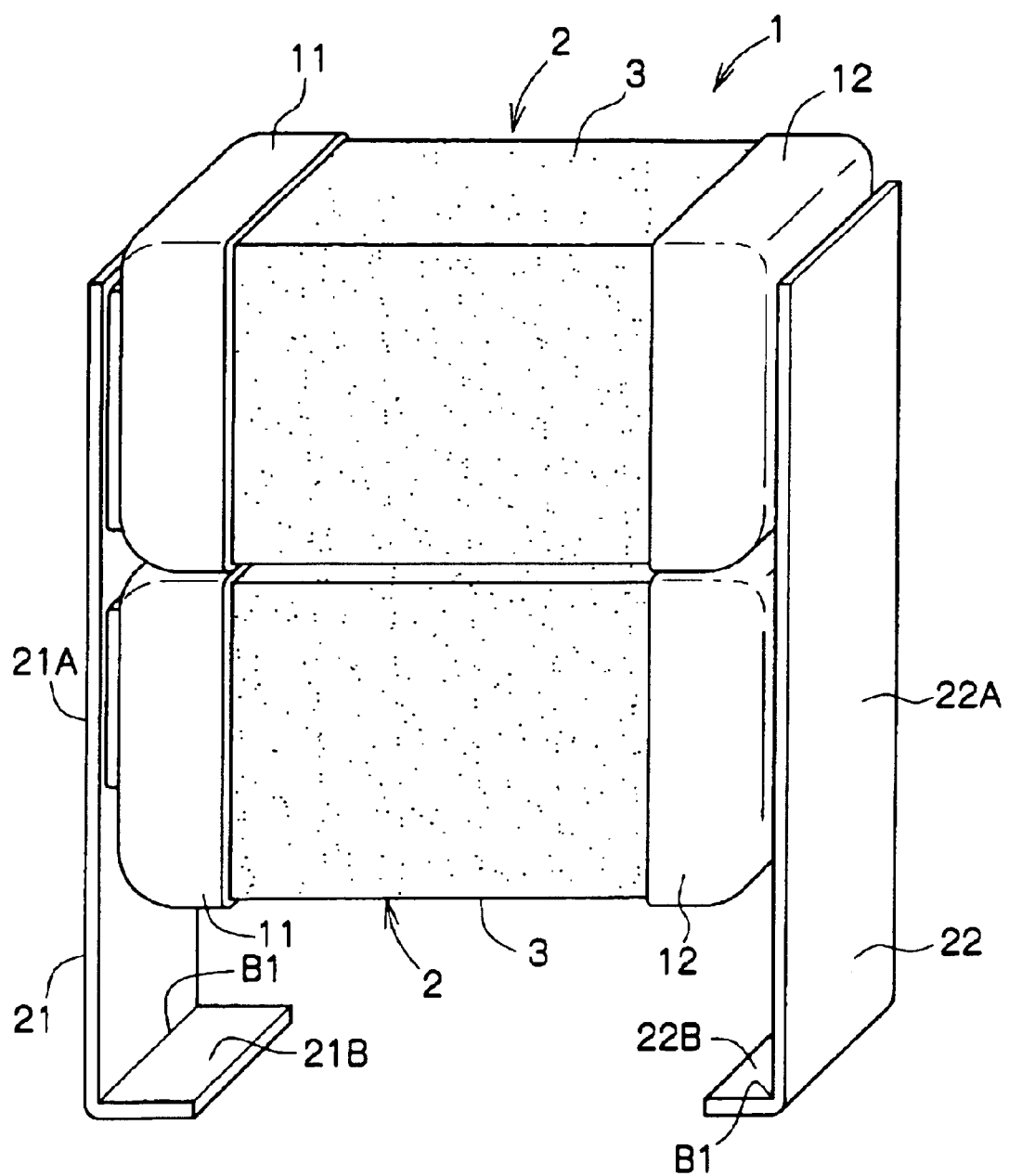
FIG. 4 is a perspective view showing a multilayer capacitor according to a second embodiment of the present invention.

Next, an electronic component according to a second embodiment of the present invention will be described based on FIG. 4 and FIG. 5. Note that the same reference numerals and symbols are used to designate the same members as those described in the first embodiment, and repeated explanation thereof will be omitted.

The multilayer capacitor 1 of the first embodiment has only the single capacitor element 2. But, a multilayer capacitor 1 according to this embodiment has two capacitor elements 2 arranged vertically, as shown in FIG. 4 and FIG. 5. A pair of metal terminals 21, 22 formed of metal materials respectively abut on both ends of the two capacitor elements 2 respectively.

Figure 5:
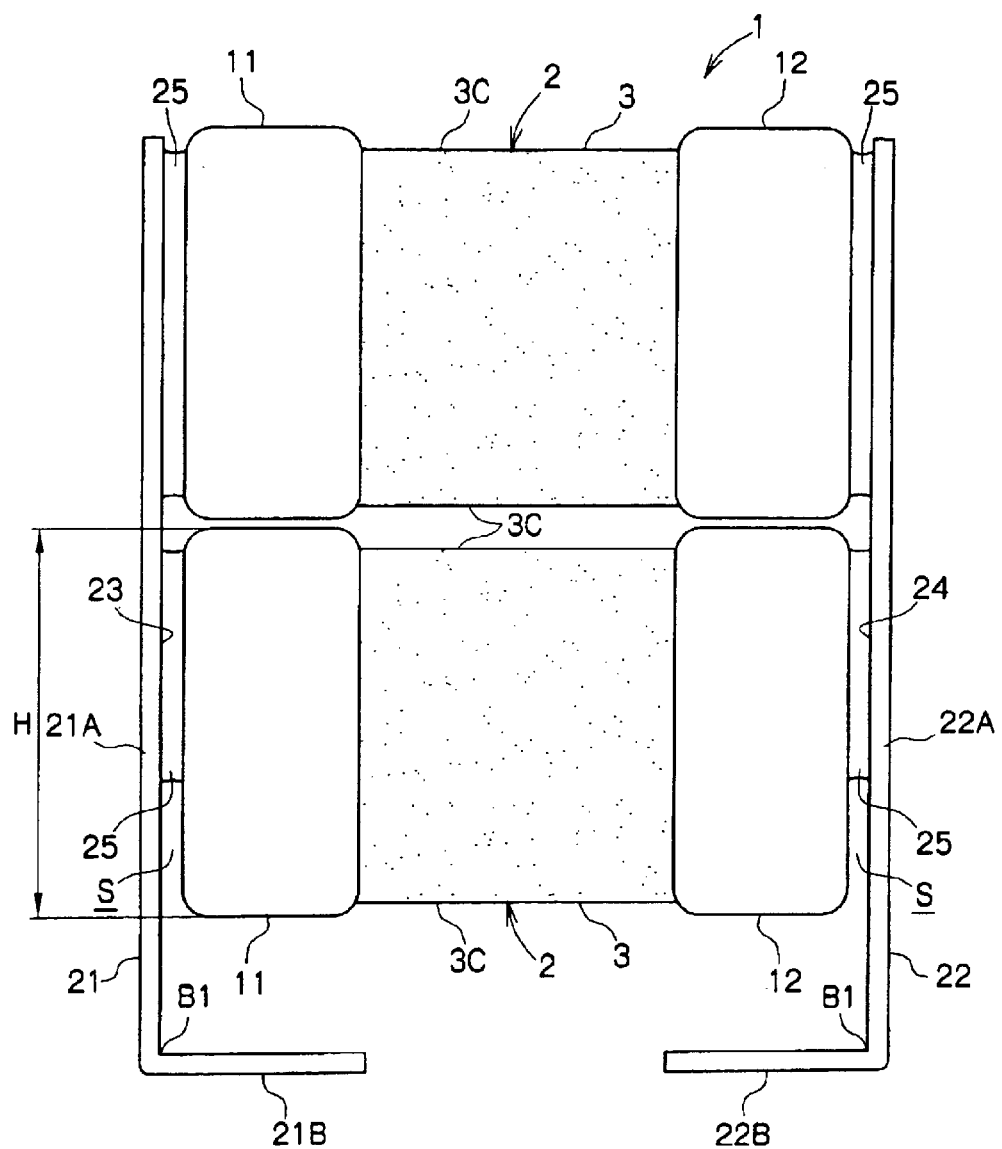
FIG. 5 is a front view showing the multilayer capacitor according to the second embodiment of the present invention.

As shown in FIG. 5, in this embodiment, the lower capacitor element 2, out of the two capacitor elements 2, that is closer to base ends of the metal terminals 21, 22 has the same structure as that of the first embodiment. Specifically, only tip side portions of the metal terminals 21, 22 in electrode facing portions 21A, 22A are connected to the terminal electrodes 11, 12 of the capacitor element 2 respectively, and gaps S exist between the base-end side portions of the metal terminals 21, 22 in the electrode facing portions 21A, 22A and the terminal electrodes 11, 12 of the capacitor element 2 respectively. Meanwhile, the upper capacitor element 2 is structured such that the entire surface of terminal electrodes 11, 12 are connected to electrode facing portions 21A, 22A.

In the structure such that the two capacitor elements 2 are vertically arranged as in this embodiment, only the lower capacitor element 2 closer to an aluminum substrate 31 needs to have the same structure as that of the first embodiment. This structure also allows the multilayer capacitor 1 according to this embodiment to fully absorb the stress and realize reduction in production cost. However, the two capacitor elements 2 may be both structured such that the electrode facing portions 21A, 22A and the terminal electrodes 11, 12 are connected only through the tip side portions of the metal terminals 21, 22 in the electrode facing portions 21A, 22A, similarly to the first embodiment.

Next, the stress distributions in various types of multilayer capacitors were studied. Specifically, the stress distribution was studied on each of the following multilayer capacitors: a capacitor element shown in FIG. 7 as a conventional multilayer capacitor without any metal terminal; a multilayer capacitor shown in FIG. 8 in which the metal terminal 21 without any fold part is adopted but the electrode facing portions 21A up to lower ends thereof are connected to the terminal electrodes 11 with the joining materials 25; and a multilayer capacitor 1 shown in FIG. 6 having the same structure as that of the multilayer capacitor 1 of the first embodiment. Concretely, the way the stress was given to each of the multilayer capacitors when an assumed deflection amount of the aluminum substrate 31 was 2 mm was simulated using a finite element method.

Figure 7:
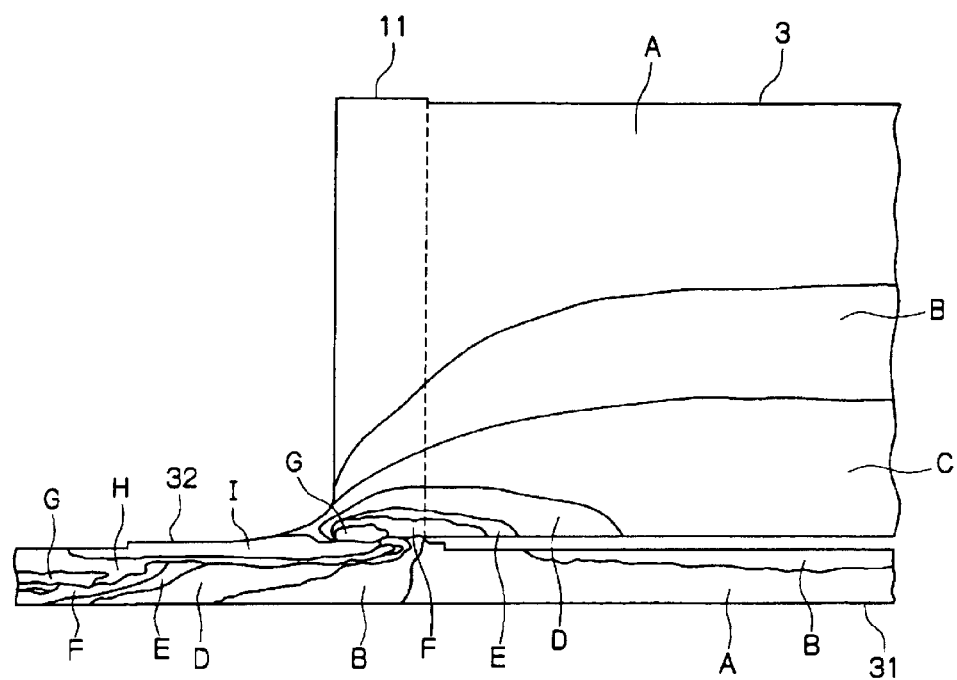
FIG. 7 is an explanatory view showing part of the distribution state of a stress given to a multilayer capacitor without any metal terminal.

First, as shown in FIG. 7, it was confirmed that at least a stress shown in areas F (concretely, a stress of 5.6 kgf/mm$^2$) was given to the multilayer capacitor when the multilayer capacitor without any metal terminal was directly joined to the aluminum substrate 31.

Figure 8:
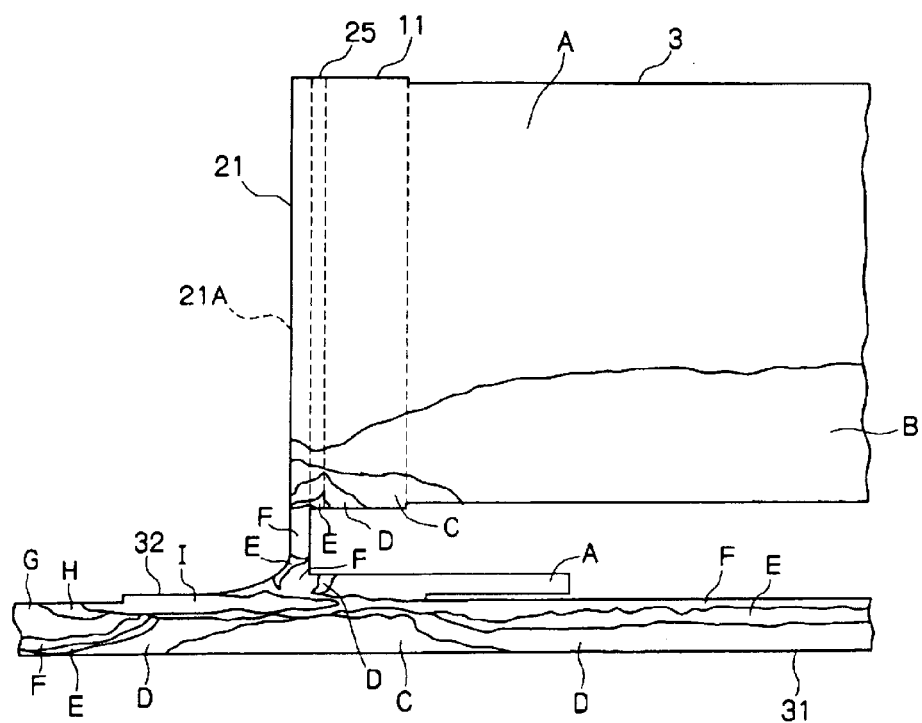
FIG. 8 is an explanatory view showing part of the distribution state of a stress given to a multilayer capacitor in which an electrode facing portion up to a lower end thereof is connected to a terminal electrode with a joining material.
Figure 9:
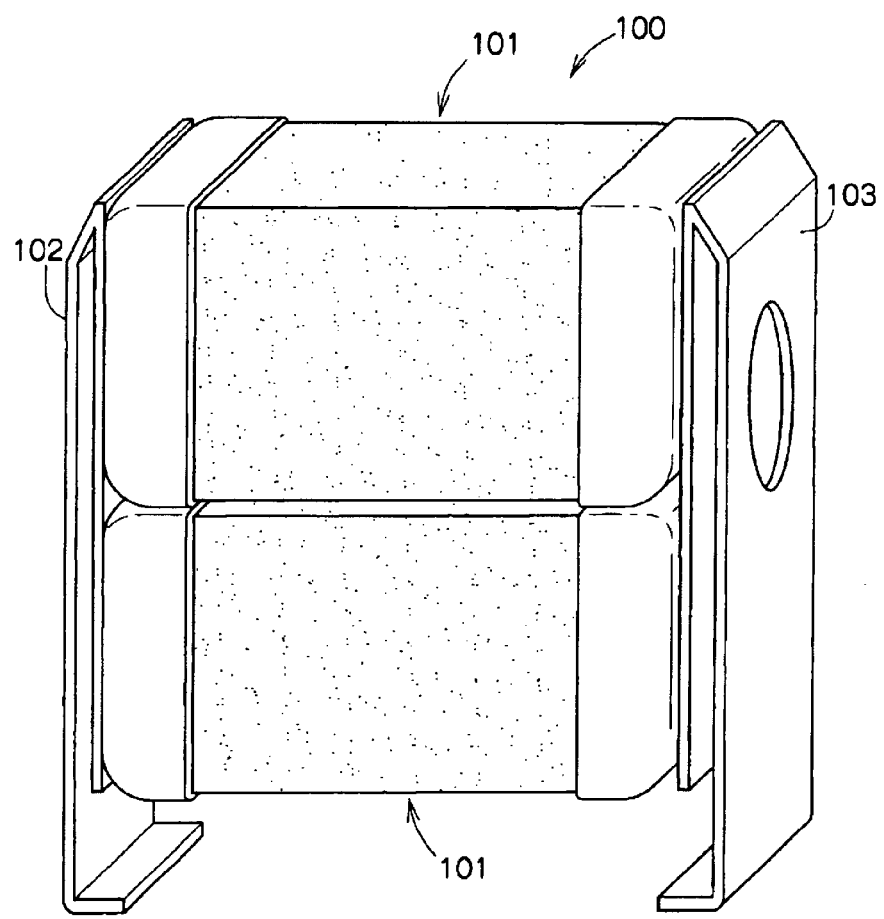
FIG. 9 is a perspective view showing a conventional multilayer capacitor.

Further, as shown in FIG. 8, it was confirmed that at least a stress shown in areas D (concretely, a stress of 3.1 kgf/mm$^2$) was given to a dielectric element 3 of the multilayer capacitor when the metal terminal without any fold part was adopted. This shows that with the structure shown in FIG. 8, no breakage occurs even when the aluminum substrate 31 is bent by, for example, up to 10 mm in a deflection test, but a certain degree of load is given to the multilayer capacitor, which may possibly cause the breakage of the multilayer capacitor due to the deflection of the aluminum substrate 31.

Figure 6:
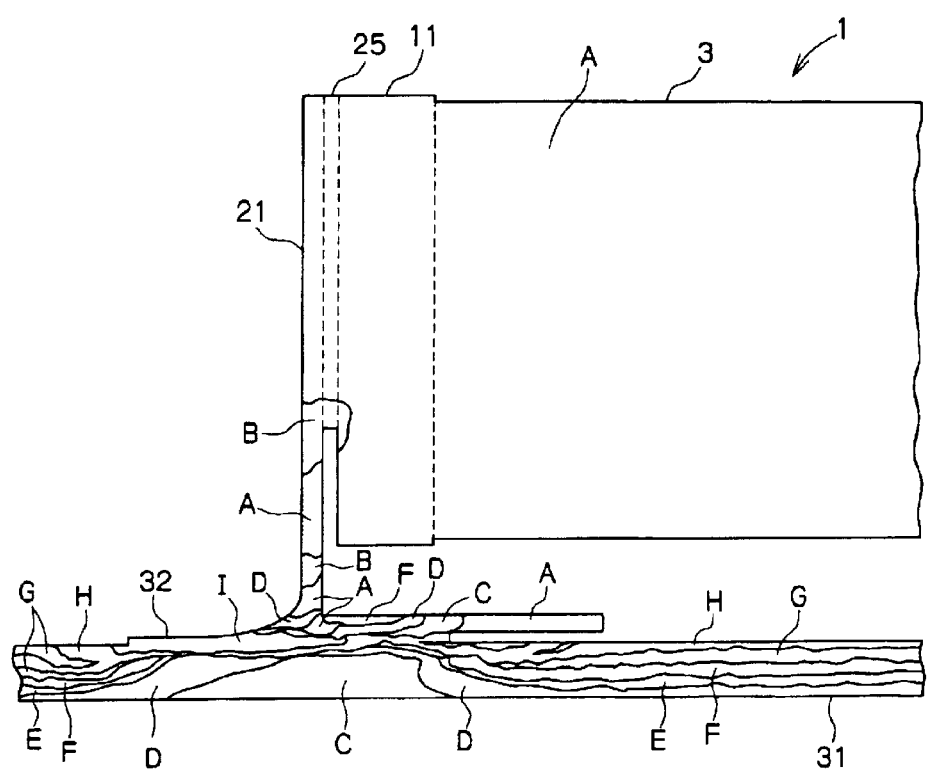
FIG. 6 is an explanatory view showing part of the distribution state of a stress given to the multilayer capacitor according to the first embodiment of the present invention.

On the other hand, as shown in FIG. 6, it was confirmed that in the multilayer capacitor 1 of the first embodiment, a stress of 2.2 kgf/mm$^2$ or less shown in areas B is given to part of the dielectric element 3 of the multilayer capacitor 1, and in addition, a stress of 1 kgf/mm² or less shown in areas A is given to substantially the entire area covering the other part of the dielectric element 3 of the multilayer capacitor 1. Therefore, with the structure shown in FIG. 6, since the stress of only 1 kgf/mm² or less is given to the multilayer capacitor 1, it can be understood that no breakage of the dielectric element 3 occurs in a deflection test of bending the aluminum substrate 31 by up to 10 mm, and in addition, the given stress is smaller.

Here, in FIG. 6 to FIG. 8, the areas A are areas of a stress of 0 kgf/mm² and not more than 1 kgf/mm², the areas B are areas of a stress of more than 1 kgf/mm² and not more than 2.2 kgf/mm², areas C are areas of a stress of more than 2.2 kgf/mm² and not more than 3 kgf/mm², the areas D are areas of a stress of more than 3 kgf/mm² and not more than 4 kgf/mm², and areas E are areas of a stress of more than 4 kgf/mm² and not more than 5 kgf/mm², the areas F are areas of a stress of more than 5 kgf/mm² and not more than 6 kgf/mm², areas G are areas of a stress of more than 6 kgf/mm² and not more than 7 kgf/mm², areas H are areas of a stress of more than 7 kgf/mm² and not more than 8 kgf/mm², and areas I are areas of a stress of more than 8 kgf/mm² and not more than 9 kgf/mm².

Next, a sample of the capacitor element being the conventional multilayer capacitor without any metal terminal, and samples of the multilayer capacitor having the same structure as that of the multilayer capacitor 1 shown in FIG. 1 with varied distances D1, D2 were prepared, and these samples were mounted on respective substrates. Then, in this state, the deflection strength of each of the samples was measured, and the stress given to each of the samples when a deflection amount was 2 mm was measured. The measurement results are shown in Table 1 below.

Here, 30 samples were prepared for each combination of the distances D1, D2 for use in the deflection strength test, and the substrate on which each of the samples was mounted was deflected by up to 15 mm at the maximum. Table 1 shows the minimum value in the deflection amounts of the samples for each combination at which the breakage of the samples occurred. Note that the conventional multilayer capacitor without any metal terminal is noted in Table 1 as "single sample".

TABLE 1

| distance D2 (mm) | distance D1 (mm) | deflection strength (mm) minimum value of deflection amount at breakage | stress given to sample at 2 mm deflection (kgf/mm²) |
|---|---|---|---|
| single sample | — | 2.8 | 5.6 |
| 0.2 | 0.2 | 7.8 | 3.8 |
| 0.4 | 0.2 | 13.2 | 3.1 |
|  | 0.4 | 12.5 | 3.1 |
| 0.6 | 0.2 | 13.7 | 2.6 |
|  | 0.4 | 13.8 | 2.6 |
| 0.8 | 0.2 | no breakage at 15 mm or less | 2.2 |
|  | 0.4 | no breakage at 15 mm or less | 2.2 |
| 1.0 | 0.2 | no breakage at 15 mm or less | 1.7 |
|  | 0.4 | no breakage at 15 mm or less | 1.7 |
| 1.2 | 0.4 | no breakage at 15 mm or less | 1.3 |
| 1.4 | 0.4 | no breakage at 15 mm or less | 0.9 |
| 1.6 | 0.4 | no breakage at 15 mm or less | 0.5 |
| 2.0 | 0.4 | no breakage at 15 mm or less | 0.1 |

As shown in Table 1, when the distance D2 is 0.8 mm or more, no breakage occurs at the deflection amount of 15 mm or less in any of the defection strength test, and the stress given to the samples at the defection amount of 2 mm is also 2.2 kgf mm². Therefore, it has been confirmed from the result in Table 1 that, when the distance D2 is 0.8 mm or more, at least the deflection strength and stress are greatly improved compared with those in the multilayer capacitor without any metal terminal.

It is conceivable that the metal terminals of the above-described embodiments are formed of a material excellent in spring characteristic and relatively low in electric resistance. A typical example thereof is a plate material of a Fe—Ni alloy. Further, typically, the plate thickness can be 0.1 mm, though not restrictive.

Further, in the above-described embodiments, the metal terminals sandwich one capacitor element or two capacitor elements. However, they may sandwich three capacitor elements or more. Moreover, the number of the internal conductors of the capacitor element is not limited to the number in the multilayer capacitor 1 according to the above-described embodiments, and may be larger than this number. Further, the order of the internal conductors in the layering direction may be arbitrarily changed.

According to the present invention, it is possible to provide an electronic component capable of fully absorbing a stress and realizing reduction in production cost.

What is claimed is:

1. An electronic component comprising:
   an element having a pair of terminal electrodes; and
   a pair of metal terminals formed of metal materials respectively and connected to the pair of terminal electrodes respectively,
   wherein a portion of the metal terminal that extends from a base-end side of the metal terminal connectable to an external circuit to face the terminal electrode of the element is an electrode facing portion, and
   wherein a tip side portion of the metal terminal in the electrode facing portion is connected to the terminal electrode, and a gap exists between a base-end side portion of the metal terminal in the electrode facing portion and the terminal electrode.

2. The electronic component according to claim 1, wherein the element has two kinds of internal conductors therein, an end of one of the internal conductors out of the two kinds of internal conductors being connected to one of the pair of the terminal electrodes, and an end of the other internal conductor being connected to the other one of the pair of terminal electrodes, thereby making the element serve as a capacitor element.

3. The electronic component according to claim 1, wherein the elements are provided in plurality, and in the element, out of the plural elements, disposed closest to the base end of the metal terminal, a gap exists between the base-end side portion of the metal terminal in the electrode facing portion and the terminal electrode.

4. The electronic component according to claim 1, wherein each of the pair of metal terminals is made of a Fe—Ni alloy.

5. The electronic component according to claim 1, wherein each of the pair of metal terminals is connected to the element via high-temperature solder as a joining material.

6. The electronic component according to claim 1, wherein each of the pair of metal terminals is connected to the element via conductive adhesive as a joining material.

7. The electronic component according to claim 1, wherein the base end of the metal terminal connectable to the external circuit serves as an external connection portion that is bent at a right angle to the other portion.

8. The electronic component according to claim 1, wherein D1 and D2 satisfy a relation of (D2−D1)≧0.4 mm where D1 is a distance between a surface of the element on the external circuit side and the base end of the metal terminal, and D2 is a distance between the portion of the metal terminal connected to the terminal electrode and the base end of the metal terminal.

9. An electronic component comprising:

an element having a pair of terminal electrodes; and a pair of metal terminals formed of metal materials respectively and connected to the pair of terminal electrodes respectively, wherein a portion of the metal terminal that extends from a base-end side of the metal terminal connectable to an external circuit to face the terminal electrode of the element is an electrode facing portion, and wherein a tip side portion of the metal terminal in the electrode facing portion is connected to the terminal electrode, and a gap exists between a base-end side portion of the metal terminal in the electrode facing portion and the terminal electrode, and wherein, when a distance between a surface of the element on the external circuit side and the base end of the metal terminal is set to 0.4 mm or less, a distance between the portion of the metal terminal connected to the terminal electrode and the base end of the metal terminal is set to 0.8 mm or more.

10. The electronic component according to claim 9, wherein the element has two kinds of internal conductors therein, an end of one of the internal conductors out of the two kinds of internal conductors being connected to one of the pair of the terminal electrodes, and an end of the other internal conductor being connected to the other one of the pair of terminal electrodes, thereby making the element serve as a capacitor element.

11. The electronic component according to claim 9, wherein each of the pair of metal terminals is made of a Fe—Ni alloy.

12. The electronic component according to claim 9, wherein a plate thickness of each of the pair of metal terminals is set to 0.1 mm.

13. The electronic component according to claim 9, wherein the base end of the metal terminal connectable to the external circuit serves as an external connection portion that is bent at a right angle to the other portion.

14. An electronic component comprising:

an element having a pair of terminal electrodes; and a pair of metal terminals formed of metal materials respectively and connected to the pair of terminal electrodes respectively, wherein portions of the respective metal terminals that extend from base-end sides of the metal terminals connectable to external circuits to face the terminal electrodes of the element are electrode facing portions, and wherein tip side portions of the pair of metal terminals in the respective electrode facing portions of the metal terminals are connected to the terminal electrodes respectively, and gaps exist between the base-end side portions of the pair of the metal terminals in the respective electrode facing portions of the metal terminals and the terminal electrodes, respectively.

15. The electronic component according to claim 14, wherein the pair of metal terminals have a same structure and a same shape.

16. The electronic component according to claim 14, wherein the element has two kinds of internal conductors therein, an end of one of the internal conductors out of the two kinds of internal conductors being connected to one of the pair of the terminal electrodes, and an end of the other internal conductor being connected to the other one of the pair of terminal electrodes, thereby making the element serve as a capacitor element.

17. The electronic component according to claim 14, wherein the elements are provided in plurality, and in the element, out of the plural elements, disposed closest to the base ends of the metal terminals, a gap exists between the base-end side portion of the metal terminal in the electrode facing portion and the terminal electrode.

18. The electronic component according to claim 14, wherein each of the pair of metal terminals is made of a Fe—Ni alloy.

19. The electronic component according to claim 14, wherein the base end of the metal terminal connectable to the external circuit serves as an external connection portion that is bent at a right angle to the other portion.

* * * * *